United States Patent [19]

Beck et al.

[11] 4,437,943

[45] Mar. 20, 1984

[54] METHOD AND APPARATUS FOR BONDING METAL WIRE TO A BASE METAL SUBSTRATE

[75] Inventors: Alexander F. Beck, Hamden; Joseph Winter, New Haven, both of Conn.

[73] Assignee: Olin Corporation, New Haven, Conn.

[21] Appl. No.: 167,178

[22] Filed: Jul. 9, 1980

[51] Int. Cl.³ .......................... C25D 5/02; C25D 5/08
[52] U.S. Cl. .................................. 204/16; 204/224 R
[58] Field of Search ............. 204/15, 16, 129.6, 224 R

[56] References Cited

U.S. PATENT DOCUMENTS

| | | | |
|---|---|---|---|
| 2,750,332 | 6/1956 | Miller | 204/15 |
| 3,071,521 | 1/1963 | Ehrhart | 204/16 |
| 3,263,057 | 7/1966 | Conti | 219/78 |
| 3,468,785 | 9/1969 | Polichette | 204/224 R |
| 3,810,829 | 5/1974 | Fletcher | 204/222 |
| 3,894,918 | 7/1975 | Corby | 204/15 |
| 3,957,614 | 5/1976 | Corby | 204/224 R |
| 4,033,833 | 7/1977 | Bestel | 204/15 |
| 4,037,772 | 7/1977 | Dupuis | 228/1 R |

FOREIGN PATENT DOCUMENTS

| | | | |
|---|---|---|---|
| 1147730 | 11/1957 | France | 204/224 R |
| 2203891 | 5/1974 | France | 204/224 R |
| 3087 | of 1904 | United Kingdom | 204/15 |
| 775359 | 5/1957 | United Kingdom | 204/224 R |

OTHER PUBLICATIONS

The Welding Encyclopedia, Thirteenth Edition, 1951, p. 367.

Primary Examiner—T. M. Tufariello
Attorney, Agent, or Firm—Barry L. Kelmachter; Paul Weinstein; Howard M. Cohn

[57] ABSTRACT

A process and apparatus for bonding lead wires to a metal substrate. A lead wire is positioned on the substrate and a spot of metal is deposited over a portion of the lead wire and metal substrate to firmly bond the wire to the substrate.

20 Claims, 2 Drawing Figures

METHOD AND APPARATUS FOR BONDING METAL WIRE TO A BASE METAL SUBSTRATE

BACKGROUND OF THE INVENTION

The present invention relates to a process and apparatus for bonding metal wire to a substrate and more particularly a process for bonding lead wires to lead frames by electrodepositing a spot of metal over a portion of the lead wire and substrate.

Presently, in the field of microelectronics, lead wires are bonded to lead frames by either a thermocompression procedure or an ultrasonic bonding technique. A typical process and apparatus for thermocompression bonding metallic elements is disclosed in U.S. Pat. No. 3,263,057. The metallic wire and substrate are positioned on a support member, and a predetermined pressure is applied to the location where the joint or bond is desired. At the same time, a predetermined amount of heat is applied to the joint area by means of an applied current so as to achieve a diffusion bond at the compression diffusion joint area. While the thermocompression bonding technique is widely employed in the field of microelectronics, it suffers from a number of disadvantages. The metal substrate to which the wire is to be bonded is generally gold plated in order to assure a strong bond and good electrical contact. The plating requirement makes the thermocompression technique extremely expensive to practice. In addition, when working with certain delicate transistors, the temperatures required to effect the thermocompression bond (temperatures as high as 400° C.) have a detrimental effect on the transistor.

A typical ultrasonic bonding method and apparatus is disclosed in U.S. Pat. No. 4,037,772. In this case a bonding head is wobbled so that a contact point on the bonding head progressively moves along the lead wire and substrate interface and acts thereion to firmly bond the lead wire in good electrical contact with the metal substrate. This particular technique has not been widely accepted in the industry due to the expensive setup costs and expensive machinery required to practice the technique.

Clearly, it would be of considerable advantage and highly desirable to effectively bond the lead wires to a substrate without incurring the high costs associated with the known techniques.

Accordingly, it is the principal object of the present invention to provide a process and apparatus for bonding a lead wire to a metal substrate by electrodepositing a spot of metal over a portion of the lead wire and substrate.

It is a particular object of the present invention to provide a process and apparatus as above which is relatively inexpensive when compared to known approaches.

Further objects and advantages of the present invention will appear hereinbelow.

SUMMARY OF THE INVENTION

In accordance with the present invention, it has been found that the foregoing objects and advantages may be readily obtained.

The present invention provides a highly efficient and economical process and apparatus for bonding lead wires to a metal substrate.

In accordance with the process of the present invention, a substrate, preferably metal, is arranged at a bonding station where it is held in place and an end of a lead wire is arranged on the substrate. A small spot of metal is electrochemically deposited in the area where the joint is desired so as to firmly bond the lead wire to the substrate material and obtain a good electrical connection between them. The joint area is also protected by the electrochemically deposited metal spot.

The apparatus for carrying out the process employs a jet arrangement for depositing the spot of metal over the lead wire and substrate. The jet nozzle opening is preferably dimensioned for depositing a spot of metal having essentially the same dimension as that of the jet nozzle opening.

The present invention provides considerable advantages over known systems for bonding lead wires to substrates. For example, by employing the process of the present invention a firm bond characterized by good electrical contact is obtained at a fraction of the cost incurred by known processes.

DETAILED DESCRIPTION

While the present invention will be described and exemplified with reference to the field of microelectronics and more particularly the bonding of lead wires to lead frames, it will be appreciated that much broader applications can be made.

Figure 1:
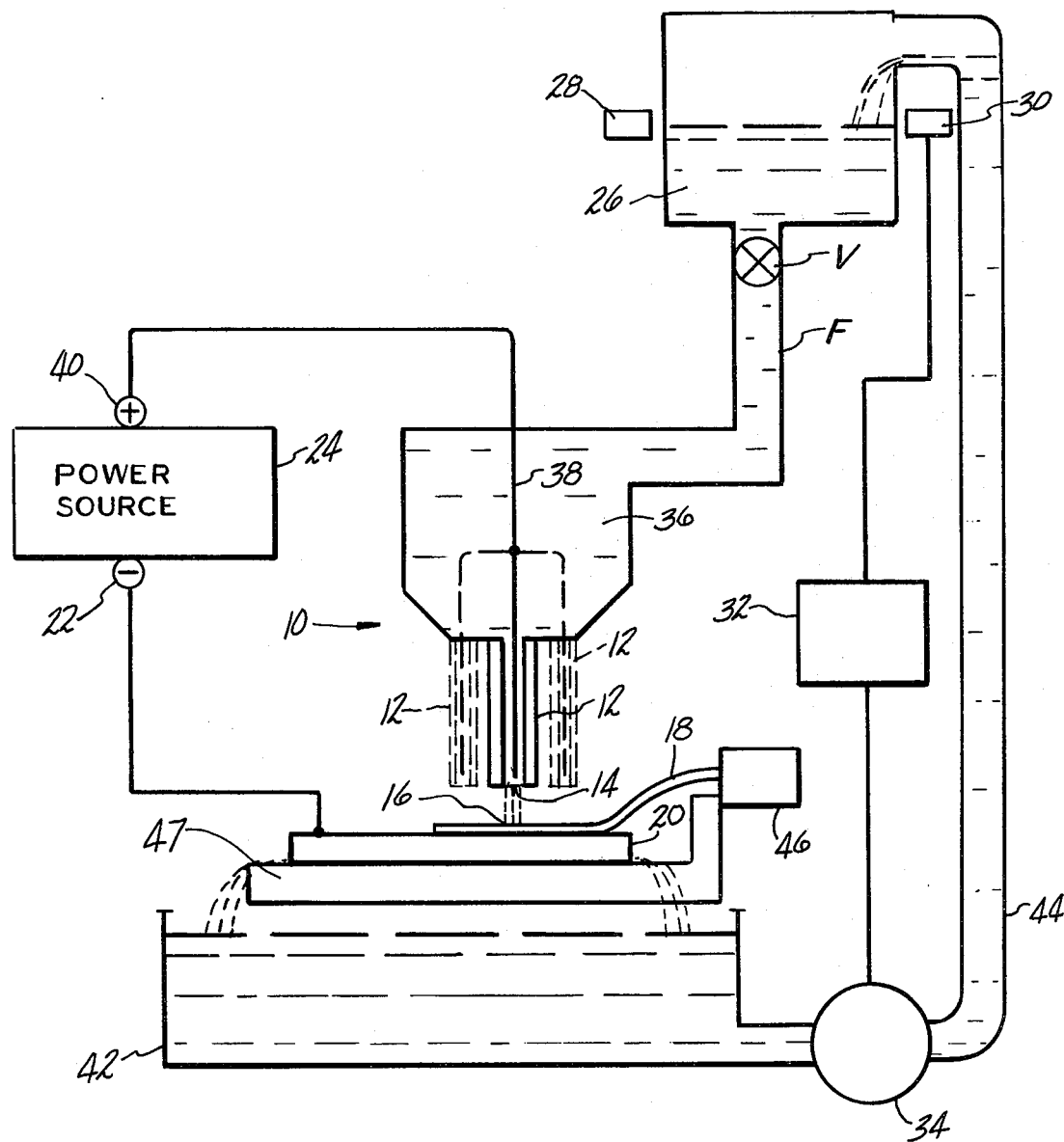
FIG. 1 is a schematic illustration of an electrodepositing bonding system according to the present invention for carrying out the process of the present invention.

Referring to FIG. 1, an alectrodepositing system for carrying out the process of the present invention is illustrated. The system comprises a plating head assembly 10 provided with at least one tubular member 12 having a jet forming nozzle outlet 14 of a desired size. As will be discussed in detail hereinbelow, the size of the plated spot of metal is a function of the nozzle outlet opening size, the distance of the nozzle outlet opening 14 from the substrate and the pressurr applied to the electrolyte stream 16. It should be appreciated that a plurality of jet forming nozzles 12 as shown in phantom of controlled size and spacing from each other may be provided in the head 10 for selectively spot bonding a plurality of lead wires 18 on a substrate in a single operation. However, for purposes of illustration, the process and apparatus of the present invention will be described with reference to a single jet forming nozzle 12.

Referring again to FIG. 1, a substrate 20 is positioned beneath the nozzle opening outlet 14 at a desired distance therefrom. The substrate 20 when in position is connected to the negative terminal 22 of a power source 24 and, therefore, becomes a cathodic element. An electrolyte reservoir 26 is provided at a desired distance above the substrate 20 so as to deliver the electrolyte from the nozzle opening outlet 14 at a desired applied pressure.

In accordance with the present invention, the pressure applied to the electrolyte stream 16 is controlled by regulating the electrolyte head pressure determined by the height of the electrolyte in the reservoir 26. This may be accomplished by using a transparent container 26 and sensing as by a light source 28 and photodetector 30 the height of the electrolyte in the container. The output of the photodetector 30 is coupled to a controller 32 which turns on and off electrolyte pump 34 as required to maintain the desired height of the electrolyte in accordance with the position of the detector 30. The electrolyte height can be varied by moving the light 28 and detector 30 up or down as desired. In this manner, the applied pressure is controlled in a simple, economical, and efficient manner.

The reservoir 26 is charged with the electrolyte and upon the opening of the non-throttling valve V the electrolyte is allowed to flow under the force of gravity from the reservoir 26 to a manifold 36 in head assembly 10 via feed line F. The electrolyte in the manifold 36 continuously flows over an anode 38 which is connected to the positive terminal 40 of power source 24. It then flows through tubular member 12 and over the substrate 20 and wire 18 and into a catch basin 42. The electrolyte is recycled to the reservoir 26 by means of the pump 34 via line 44. Depending on the electrolyte composition, the anode 38 may be consumable or passive as desired. In the case of electrodepositing a gold spot, a consumable anode 38 is not required. In such a case the system may be simplified by eliminating the anode 38 and making the tubular element 12, preferably stainless steel so that it becomes the anode.

With the system as described above, plating by the constant flow of electrolyte only occurs when a minimum potential voltage difference is applied between the substrate 20 and the electrolyte in contact with the anode 38.

Motive means 46 supported by frame 47 is provided for feeding the lead wire to the substrate 20 and positioning the lead wire in its proper location thereon. The details of the particular motive means 46 employed forms no part of the present invention and may be a conventional stitching tool for feeding the lead wire as is commonly employed in thermocompression bonding.

The electrodepositing system of the present invention preferably allows for relative movement between the head assembly 10 and the substrate 20 so as to allow a plurality of lead wires 18 to be selectively bonded to the substrate 20. This may be accomplished either by movement of the head assembly 10 or movement of the substrate 20 in a conventional fashion.

In operation, the electrolyte reservoir 26 is charged with electrolyte, and valve V is opened so as to allow the electrolyte to flow under the force of gravity to the manifold 36 over the anode 38 through tubular member 12 and out jet forming nozzle opening 14 onto the substrate 20 and into the sump 42 from which the electrolyte is recirculated to the reservoir 26 by the pump 34 as required to maintain the desired electrolyte level. Thus, the electrolyte continuously flows until the valve V in line F is closed. The workpiece or substrate 20 is brought into proximity with the head assembly 10 and connected to terminal 22 so that the flowing electrolyte contacts the substrate 20. Motive means 46 feeds the lead wire to be bonded to the substrate 20 and positions the wire in its proper location thereon under the jet nozzle opening 14. Current is then applied to anode 38 and cathode 20 for a small amount of time so as to electrodeposit a spot of metal such as gold over a portion of the lead wire 18 and substrate 20 thereby bonding the wire to the substrate.

The lead wire may comprise materials such as gold, silver, copper, gold plated copper and nickel or combinations thereof. The substrate should be electrically conductive or be coated with an electrically conductive material. The substrate surface material may include gold or silver either pure or alloyed or other desired metal or alloy. Likewise, the electroplated metal spot may be gold, copper, nickel, silver, or their alloys as well as other suitable electroconductive materials which may be electrodeposited.

As noted above, the resolution and size of the plated spot is a function of the nozzle opening size 14, the distance of the nozzle opening 14 from the substrate 20, and the pressure applied to the electrolyte. To obtain such a selective spot plating of a desired limited area, i.e. an area substantially equal to the dimension of the jet forming nozzle opening 14, it is necessary to control and maintain the shape of the electrolyte stream 16 as it travels from the nozzle 12 to the substrate 20. It is necessary to maintain the electrolyte stream 16 so that there is little fanning out of the electrolyte before impinging on the surface of the substrate 20 and so that the flowing film of electrolyte on the substrate 20 is thin except in the region of the stream 16.

In order for plating to take place, it is necessary to have a minimum potential voltage, above 5 volts and preferably less than 50 volts, across the anode 38 and cathode 20. If the electrolyte column or stream 16 is maintained in the same shape as the nozzle outlet opening 14, the voltage and current in the thin flowing film area is nil due to high electrical resistance. However, if the electrolyte column is not maintained but allowed to coarsely fan out, the resistance in the fanned out area is not particularly high and, therefore, the voltage not so low as to prohibit plating. Thus, when the electrolyte stream 16 is not maintained as a well-defined column, an area substantially larger than the nozzle opening 14 would be plated. When the stream 16 is maintained as a well-defined column substantially to the substrate 20, then the area plated corresponds to that of the nozzle opening.

The electrolyte stream 16 is maintained by controlling the nozzle opening 14 dimension, the pressure applied to the electrolyte and the nozzle to substrate spacing. In accordance with the present invention, the nozzle opening 14 major dimension, such as diameter, is chosen so that it is effectively equal to the desired spot size to be plated.

Preferably the nozzle opening major dimension comprises about 0.25 mm to 5 mm, most preferably 0.5 mm to 1.5 mm and ideally about 1.0 mm.

The nozzle opening 14 is placed as close to the substrate 20 as possible in order to limit the travel distance of the electrolyte stream 16 thereby reducing the electrical resistance of the stream and correspondingly the energy required to effect plating. By shortening the distance the stream 16 travels, it is easier to limit the fanning out of the electrolyte column. Naturally, a minimum distance between the nozzle opening 14 and substrate 20 must be maintained in order to avoid an electrical shorting effect and eliminate splashing of the electrolyte on the substrate 20 which would result in the same effect as the fanned out column discussed above. A distance of 5 to 10 mm has been found effective for most bonding applications.

The pressure applied to the electrolytic stream 16 is a function of the nozzle opening 14 dimension. It is necessary that the electrolyte flow from the nozzle opening 14 at a rate sufficient to maintain a substantially uniform electrolyte column. It has been found that a flow rate of about 0.5 mls per second to 1.0 mls per second is sufficient for most applications. Ideally, 0.7 mls per second is employed. The required flow rate is accomplished by applying a pressure of from about 1 to 3 psi for the desired nozzle openings 14 set forth above.

As noted above, a minimum voltage of about 5 volts is required to effect a spot plating under the parameters of nozzle opening 14 dimension, nozzle to substrate 20 spacing and electrolyte flow rate. Ideally, the voltage is under 50 volts to avoid undesirable heat buildup and energy losses. A 20 volt potential has been found most desirable. The thickness of the spot plating is a function of current and time. A current of about 3 amps/cm$^2$ has been found most suiable for a time of from 5 to 10 seconds to obtain a deposit of from 50 to 100 microns thick. However, any desired current or time could be employed.

The process of the present invention will be more readily understood from a consideration of the following examples.

EXAMPLE I

Figure 2:
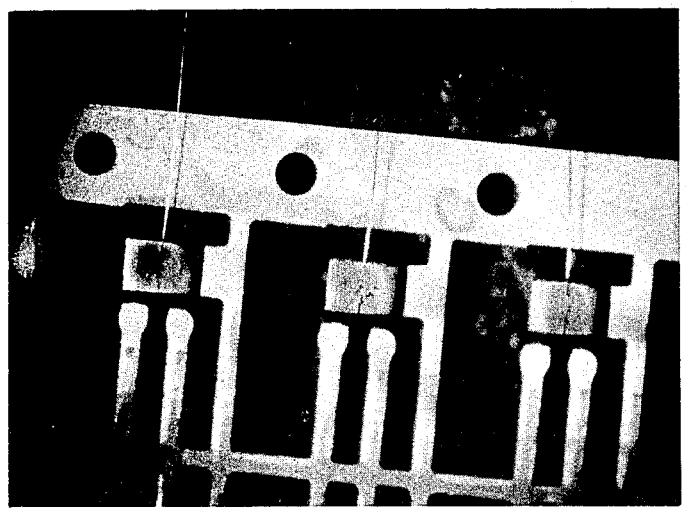
FIG. 2 is a photomacrograph at about 7X magnification illustrating the bond obtained when using the process and apparatus of the present invention.

An electrodepositing system described above was provided with a stainless steel tube 12 connected as the anode 38. The tube had a jet nozzle opening 14 of 1 mm in diameter. Commercially available Englehardt Industries' E-70 composition was employed as the electrolyte and was allowed to flow through the tube at a rate of 0.7 mls/second. A typical T. 0.20 copper lead frame was positioned under the stainless steel tube and connected in as the cathode 22 at a separation distance of 7 mm from the anode 12. A gold lead wire was positioned on the lead frame at the desired location. A metal spot was deposited over the lead wire and substrate by passing 0.03 amperes of current at 20 volts for 10 seconds. The overall thickness of the deposit was about 70 microns, and the diameter was about 0.85 mm. The lead wire was firmly bonded to the lead frame and was in good electrical contact therewith. FIG. 2 is a photomacrograph showing lead wires which were bonded to contacts of a lead frame under these operating conditions.

EXAMPLE II

A second group of gold lead wires were bonded to a lead frame under the same conditions as set forth in Example I except the current was passed for only 6 seconds. The overall thickness of the deposit was about 50 microns, and the diameter was about 0.85 mm. Again, a strong bond and good electrical contact between the wire and the lead frame were obtained under these operating conditions.

While the process and apparatus of the present invention have been described and exemplified with reference to the field of microelectronics, it will be appreciated that much broader applications can be made.

mm is an abbreviation for millimeters.

mls. is an abbreviation for milliliters.

The electrolyte used to plate the metal spot in accordance with this invention may have any desired composition as are well-known in the art. The apparatus of this invention is adapted to utilize electrolytes which require consumable or non-consumable electrodes. The metal which is plated may be any desired metal or other material suitable for bonding the wire to the substrate. Preferably, the plated metal is one having a high electrical conductivity such as gold, silver, or copper.

The U.S. patents set forth in this application are intended to be incorporated by reference herein.

It is apparent that there has been provided in accordance with this invention an electrodeposition bonding process and apparatus which fully satisfy the objects, means, and advantages set forth hereinbefore. While the invention has been described in combination apparent to those skilled in the art in light of the foregoing description. Accordingly, it is intended to embrace all such alternatives, modifications, and variations as fall within the spirit and broad scope of the appended claims.

What is claimed is:

1. An apparatus for bonding a substrate to a lead wire comprising:
    means for supporting said substrate and said lead wire in an overlappiing relationship and in physical contact with each other; and
    means for electrodepositing a spot of material over at least a portion of said substrate and said lead wire to firmly bond said physically contacting substrate and lead wire.

2. An apparatus as in claim 1 wherein said electrodepositing means comprises:
    an anode;
    means for electrically connecting said substrate as a cathode;
    means for flowing an electrolyte stream in the form of a column from said anode to said overlapped substrate and lead wire; and
    means for passing a current between said anode and said substrate whereby said spot of material is formed over said portion of said overlapped substrate and lead wire.

3. An apparatus as in claim 1 further including means for positioning said lead wire over said substrate.

4. An apparatus as in claim 2 wherein said means for flowing said electrolyte stream in the form of a column comprises a jet forming nozzle.

5. An apparatus as in claim 4 further including means for supplying said electrolyte to said jet forming nozzle and means for maintaining at said nozzle a desired pressure of said electrolyte in order to form said column.

6. An apparatus as in claim 5 wherein said means for maintaining said desired pressure of said electrolyte at said nozzle comprises means for supporting a supply of electrolyte above said nozzle at a desired level.

7. An apparatus as in claim 6 wherein said means for supporting said supply of electrolyte further includes means for maintaining said desired level of said electrolyte above said nozzle.

8. An apparatus as in claim 4 wherein said anode is arranged within said jet forming nozzle.

9. An apparatus as in claim 4 wherein said jet forming nozzle is formed of a conductive material and is electrically connected as said anode.

10. An apparatus as in claim 4 wherein said jet forming nozzle defines an opening whose major dimension is from about 0.25 mm to about 5 mm.

11. An apparatus as in claim 1 wherein said means for electrodepositing said spot of material is adapted to electrodeposit a plurality of spots of material over at least a portion of a corresponding plurality of lead wires arranged in overlapping relationship with at least one substrate.

12. An apparatus as in claim 1 wherein said material comprises a metal selected from the group consisting of gold, silver, and copper.

13. A process for bonding a substrate to a lead wire comprising:

supporting said substrate and said lead wire in an overlapping relationship and in physical contact with each other; and electrodepositing a spot of material over at least a portion of said substrate and said lead wire to firmly bond said physically contacting substrate and lead wire.

14. A process as in claim 13 wherein said electrodepositing step comprises:

providing an anode;

electrically connecting said substrate as a cathode;

flowing an electrolyte stream in the form of a column from said anode to said overlapped substrate and lead wide; and passing a current between said anode and said substrate whereby said spot of material is formed over said portion of said overlapped substrate and lead wire.

15. A process as in claim 13 further including the step of positioning said lead wire over said substrate.

16. A process as in claim 14 wherein said step of flowing said electrolyte stream in the form of a column comprises providing a jet forming nozzle and supplying said electrolyte to said jet forming nozzle.

17. A process as in claim 16 further including the step of maintaining at said nozzle a desired pressure of said electrolyte in order to form said column.

18. A process as in claim 17 wherein said step of maintaining said desired pressure of said electrolyte at said nozzle comprises supporting a supply of electrolyte above said nozzle at a desired level.

19. A process as in claim 18 wherein said step of supporting said supply of electrolyte includes maintaining said desired level of said electrolyte above said nozzle.

20. A process as in claim 13 wherein said step of electrodepositing said spot of material comprises the step of electrodepositing a plurality of spots of material of desired spacing and arrangement over respective portions of a plurality of said lead wires arranged in overlapping relationship with at least one substrate.

* * * * *